United States Patent
Wang et al.

(10) Patent No.: US 11,614,657 B2
(45) Date of Patent: Mar. 28, 2023

(54) FULL-SCREEN OPTICAL COMPONENT AND ELECTRONIC DEVICE

(71) Applicant: Huawei Technologies Co., Ltd., Shenzhen (CN)

(72) Inventors: Minchang Wang, Shenzhen (CN); Wenxiong Wei, Hangzhou (CN); Yi Hu, Hangzhou (CN); Yonghao Zhu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 297 days.

(21) Appl. No.: 17/126,722

(22) Filed: Dec. 18, 2020

(65) Prior Publication Data

US 2021/0103188 A1 Apr. 8, 2021

Related U.S. Application Data

(63) Continuation of application No. PCT/CN2019/110649, filed on Oct. 11, 2019.

(30) Foreign Application Priority Data

Oct. 11, 2018 (CN) .......................... 201811183823.7

(51) Int. Cl.
*G02F 1/1335* (2006.01)
*G02F 1/1333* (2006.01)
(Continued)

(52) U.S. Cl.
CPC ....... *G02F 1/133607* (2021.01); *G02B 5/045* (2013.01); *G02B 5/208* (2013.01);
(Continued)

(58) Field of Classification Search
CPC .......... G02F 1/133607; G02F 1/13318; G02F 1/133605; G02B 5/208
(Continued)

(56) References Cited

U.S. PATENT DOCUMENTS 8,204,283 B2 6/2012 Wu
10,410,036 B2 9/2019 He et al.
(Continued)

FOREIGN PATENT DOCUMENTS

CN 205539838 U 8/2016
CN 107004130 A 8/2017
(Continued)

*Primary Examiner* — Charles S Chang
(74) *Attorney, Agent, or Firm* — Conley Rose, P.C.

(57) ABSTRACT

A full-screen optical component, applied to an electronic device comprising a display screen, comprising a backlight module, an active light sensor including a sensor and a light emitter, and a dimmer. The display screen and the active light sensor are located on two opposite sides of the backlight module. The backlight module includes a first prism film and a second prism film stacked on the first prism film. The first prism film includes several first prisms. The second prism film includes several second prisms. The first prism includes a first in-light surface, and the second prism includes a second in-light surface. A display surface of the display screen, the first in-light surface, and the second in-light surface are disposed in parallel. The dimmer is configured to direct light emitted by the light emitter to the first in-light surface at an incident angle that is inclined relative to a vertical direction.

20 Claims, 14 Drawing Sheets

(51) Int. Cl.
  *G02F 1/13357* (2006.01)
  *G02F 1/133* (2006.01)
  *F21V 8/00* (2006.01)
  *G02B 5/20* (2006.01)
  *G02B 5/04* (2006.01)

(52) U.S. Cl.
  CPC ....... *G02B 6/0053* (2013.01); *G02F 1/13318* (2013.01); *G02F 1/133314* (2021.01); *G02F 1/133605* (2013.01); *G02F 1/133608* (2013.01); *G02F 2201/58* (2013.01); *G02F 2203/11* (2013.01)

(58) Field of Classification Search
  USPC .................................................. 349/12, 61–68
  See application file for complete search history.

(56) References Cited

U.S. PATENT DOCUMENTS

2017/0262026 A1* 9/2017 Jin ........................ G01S 17/08
  2017/0270342 A1   9/2017 He et al.
  2017/0351901 A1  12/2017 Kim et al.
  2018/0046281 A1   2/2018 Pi et al.
  2018/0060642 A1   3/2018 Kim et al.
  2018/0260602 A1   9/2018 He et al.
  2018/0315803 A1  11/2018 Jin

FOREIGN PATENT DOCUMENTS

| | | |
  |---|---|---|
  | CN | 107193412 A | 9/2017 |
  | CN | 107480584 A | 12/2017 |
  | CN | 107580709 A | 1/2018 |
  | CN | 107784262 A | 3/2018 |
  | CN | 107844247 A | 3/2018 |
  | CN | 207799711 U | 8/2018 |
  | CN | 207833542 U | 9/2018 |
  | CN | 108616618 A | 10/2018 |
  | CN | 106055178 B | 6/2019 |
  | JP | 2010072287 A | 4/2010 |

* cited by examiner

FULL-SCREEN OPTICAL COMPONENT AND ELECTRONIC DEVICE

CROSS-REFERENCE TO RELATED APPLICATIONS

This application is a continuation of International Patent Application No. PCT/CN2019/110649, filed on Oct. 11, 2019, which claims priority to Chinese Patent Application No. 201811183823.7, filed on Oct. 11, 2018. The disclosures of the aforementioned applications are hereby incorporated by reference in their entireties.

TECHNICAL FIELD

The present disclosure relates to the field of terminal technologies, and in particular, to a full-screen optical component and an electronic device.

BACKGROUND

Active optical devices play a very important role in intelligent electronic devices such as a mobile phone and a tablet computer. When working, these devices actively emit a light beam and implement a specific function, such as an optical proximity sensor, based on an optical signal reflected by a surrounding object. To avoid being perceived by a user, these devices emit signals in an infrared band. It is a conventional means to provide a hole on a housing of a mobile phone to ensure an optical path of the devices.

However, currently fierce competition for a screen-to-body ratio of a terminal takes place among various manufacturers. In other approaches, to implement a large display screen, a mobile phone screen is cut in a special shape, to leave a notch frame for placing these sensors that require holes, or a narrow slit is left at a connection location between a frame and the screen such that these active optical devices can emit light. However, a real full screen still cannot be implemented.

SUMMARY

The present disclosure provides an optical component that implements full-screen display of a display screen, and an electronic device.

An embodiment of the present disclosure provides a full-screen optical component, applied to an electronic device such as a mobile phone, where the electronic device includes a display screen, the optical component includes a backlight module, an active light sensor, and a dimmer, and the display screen and the active light sensor are located on two opposite sides of the backlight module.

The backlight module includes a first prism film and a second prism film stacked on the first prism film, the first prism film includes several first prisms disposed in parallel, the second prism film includes several second prisms disposed in parallel, and a long axis of the first prism and a long axis of the second prism are perpendicular to each other. The first prism includes a first in-light surface and a first out-light surface, the second prism includes a second in-light surface and a second out-light surface, and a display surface of the display screen, the first in-light surface, and the second in-light surface are disposed in parallel.

The active light sensor includes a sensor and a light emitter, and the sensor is configured to sense a reflected light signal of light emitted by the light emitter. The active light sensor includes an optical proximity sensor, a time of flight sensor, an iris recognition sensor, a dot matrix projector used for face recognition, a flood lighting device, and the like.

The dimmer is configured to direct the light emitted by the light emitter to the first in-light surface at a first incident angle that is inclined relative to a vertical direction such that the light is then emitted from the first out-light surface after being refracted by the first prism, enters the second in-light surface at a second incident angle that is inclined relative to the vertical direction, and is emitted from the second out-light surface after being refracted by the second prism such that the light passes through the display screen at a vertical angle. The first incident angle is different from the second incident angle. It should be noted that an error is allowed in the vertical angle at which the light passes through the display screen. For example, an angle deviation may be added to or subtracted from 90 degrees. A person skilled in the art may determine the specific allowable angle deviation using an indicator that needs to be reached in an actual application, and details are not described in this embodiment.

In the optical component in this embodiment of the present disclosure, the active light sensor is disposed on a backlight side of the display screen, and emission light (probe light) of the active light sensor is incident on the prism films at a tilt angle using the dimmer, to ensure that the light of the active light sensor can pass through the backlight module and the display screen. In addition, the light can be emitted vertically from the display screen to ensure transmittance of passing through the prism films by the probe light, to ensure sensing performance of the active light sensor. It is unnecessary to reserve a position of a light passage hole on a side of the display screen of the optical component or additionally provide a light passage hole on a housing, to implement a real full-screen large screen form of the display screen. In addition, no holes can be seen on the appearance, which is conducive to an elegant appearance design. In this embodiment, the active light sensor is an optical proximity sensor configured to assist a terminal in controlling the screen of the optical component to be on or off, to prevent the screen from being touched by accident in use.

Further, in a coordinate system in which a direction perpendicular to the display screen is a Z-axis, a long-axis direction of the first prism is a Y-axis, and a long-axis direction of the second prism is an X-axis, an origin of the coordinate system is located on incident light incident on the first prism film or an extension line of the light.

The dimmer enables that an included angle between the Z-axis and a projection of the light incident on the first in-light surface and on the second in-light surface on a plane of the X-Z axes is α, and that an included angle between the Z-axis and a projection of the light incident on the first in-light surface and on the second in-light surface on a plane of the Y-Z axes is α, where α meets the following relational expression $$\alpha = \arcsin\left(\eta\cos\left(\frac{\gamma}{2} + \arcsin\left(\frac{\cos(\frac{\gamma}{2})}{\eta}\right)\right)\right),$$

where γ is a degree of a vertex angle of the first prism and the second prism, and η is a refractive index of a material of the first prism and the second prism. In this embodiment, for example, all directions of the Z, X, and Y axes are positive directions. A starting point of the incident light of the active light sensor is the origin, and a degree of the included angle α is set based on the degree of the vertex angle and the refractive index of the first prism and the second prism. Therefore, the degree of the included angle α may be calculated based on the known degree of the vertex angle and refractive index of the first prism and the second prism, to design an actual angle of the light emitted by the light emitter. The corresponding actual angle of the light emitted by the light emitter can be determined based on the degree of the vertex angle and the refractive index of the first prism and the second prism, to meet requirements of different liquid crystal displays.

In an embodiment, the electronic device includes a substrate, the substrate includes an end face parallel to the display surface of the display screen, the dimmer is disposed on the end face of the substrate, the dimmer includes a bevel, an included angle between the Y-axis and an intersection line of the bevel and the YZ plane is the included angle α, an included angle between the X-axis and an intersection line of the bevel and the XZ plane is the included angle α, and the light emitter is located on the bevel and emits light perpendicular to the bevel. The substrate may be a circuit board of the electronic device, or may be a line board of the active light sensor, and the light emitted by the light emitter is incident on the first in-light surface at the inclined incident angle such that the light emitted by the light emitter enters the prism films at a non-right angle, to prevent the light from being completely reflected back, and ensure the transmittance of passing through the backlight module and the display screen by the light.

Further, the included angle between the Z-axis and the projection of the incident light on the plane of the X-Z axes is α, and the included angle between the Z-axis and the projection of the incident light on the plane of the Y-Z axes is α. The degree of the included angle α is calculated based on the incident angle and the foregoing formula, to determine an angle of the bevel of the dimmer. The included angle α between the projection of the incident light and the Z-axis is first calculated using the formula such that the included angle α between the bevel and the end face can be designed for prisms with different degrees of vertex angles and reflective indexes. The dimmer in this embodiment has a simple structure and is easy to implement.

In this embodiment, the sensor is mounted on the end face of the substrate, and a photosensitive end face of the sensor is parallel to the end face of the substrate, to ensure an effective receiving area of the sensor. In another manner, both the sensor and the light emitter are mounted on the bevel of the dimmer, and the photosensitive end face of the sensor and an emission end face of the light emitter are disposed at an included angle relative to the end face of the body. This structure may facilitate packaging of the active light sensor.

It may be understood that an embodiment of the present disclosure provides an active light sensor, including a substrate, a light emitter, a sensor, and a dimmer. The substrate includes an end face parallel to the display surface of the display screen, the dimmer is disposed on the end face of the substrate, the dimmer includes a bevel, an included angle between a Y-axis and an intersection line of the bevel and a YZ plane is an included angle α, an included angle between an X-axis and an intersection line of the bevel and an XZ plane is the included angle α, and the light emitter is located on the bevel and emits light perpendicular to the bevel. The sensor is located on the substrate. The active light sensor itself is provided with the dimmer, which is applicable to an electronic device such as a mobile phone that does not need to be provided with a light passage hole, and cooperates with a backlight module with a light passage hole to implement full-screen setting of the display screen.

In another embodiment of the present disclosure, the dimmer is a right-angle prism film, including several parallel and spaced right-angle prisms. In addition, long axes of the several right-angle prisms are perpendicular to an extension direction of an angle bisector of an included angle between the X-axis and the Y-axis. Bottom surfaces of the several right-angle prisms are parallel to the display screen. The light emitted by the light emitter of the active light sensor is incident at a right angle on a bottom surface of the right-angle prism, and is emitted from a right-angle surface of the right-angle prisms, and is directly incident on the first in-light surface. An extension direction of the right-angle surface is perpendicular to the first in-light surface, and an emergent angle between the light and the right-angle surface is the same as the first incident angle. In this embodiment, through deflection of light in the right-angle prism, inclined light is emitted, and an emergent angle is formed such that the light emitted by the light emitter enters the prism films at a non-right angle, to prevent the light from being completely reflected by the prism films, and ensure that the light can pass through the backlight module and the display screen and has relatively high transmittance. In this embodiment, the right-angle prism film is made of a polyethylene terephthalate material.

In the foregoing two embodiments, the dimmer adjusts angles at which the light of the light emitter is incident on the first in-light surface and the second in-light surface, to prevent the light from entering the prism film at a right angle and being completely reflected by the prism film, thereby ensuring transmittance of the incident light and further ensuring sensitivity of the active light sensor.

In this embodiment, an included angle between a bevel of the right-angle prism and the bottom surface is θ, n is a refractive index of the right-angle prism, a degree of an emergent angle of the light emitted from the right-angle surface is φ, and the included angle θ meets the following formula $$\theta = (a\sin(\cos(\varphi)/n) + \pi/2)/2.$$

The vertex angle and the refractive index of the first prism and the second prism are known, and that the light passes through the display screen vertically is used as a known condition. In the coordinate system, the right-angle surface is parallel to the Z-axis, and a degree value of the emergent angle φ is obtained through measurement, to obtain a degree value of the included angle θ.

In this embodiment, the angle φ meets $\varphi = a\tan(\sqrt{2}\tan\alpha)$, and α may be obtained based on the following relational expression $$\alpha = \arcsin\left(\eta\cos\left(\frac{\gamma}{2} + \arcsin\left(\frac{\cos(\frac{\gamma}{2})}{\eta}\right)\right)\right).$$

Further, in this embodiment, the light emitted by the light emitter is perpendicular to the XY plane, the bottom surface of the right-angle prism film is parallel to the XY plane, and the bottom surface of the right-angle prism is located on the light emitter. Specifically, the right-angle prism film is stacked on the emission end face of the light emitter, or the right-angle prism film is stacked on the emission end face of the light emitter and the sensing end face of the sensor, and the emission end face and the sensing end face are on a same horizontal plane. The sensing end face of the sensor is located on the same plane as the emission end face, and the right-angle prism film is directly disposed on an operating end face of the active light sensor, to facilitate packaging of the active light sensor. When the right-angle prism film is stacked on the emission end face of the light emitter, the sensing end face of the sensor does not need the right-angle prism film, thereby reducing an area of the right-angle prism film and reducing production costs.

In this embodiment, the backlight module includes a light guide plate and a reflector plate, and the first prism film and the reflector plate are respectively stacked on a light emitting side and an opposite side of the light emitting side of the light guide plate. The reflector plate is configured to reflect visible light and transmit infrared light. Visible light of a light source of the backlight module is reflected by the reflector plate, then enters the light guide plate, and is emitted from the light emitting side. The right-angle prism film is stacked between the light guide plate and the reflector plate. Alternatively, the right-angle prism film is stacked on a surface of the reflector plate that is opposite to the light guide plate. Infrared light of the active light sensor may directly pass through the reflector plate to enter the light guide plate and the prism film. Therefore, the infrared light of the active light sensor is not affected by the reflector plate, no holes need to be provided, and a manufacturing process is simple.

In this implementation, the emission end face of the light emitter is parallel to a plane on which the display screen is located, and faces the right-angle prism film. The sensing end face of the sensor and the emission end face are located on the same plane or disposed obliquely. When the sensing end face of the sensor and the emission end face are on the same plane, and the right-angle prism film is disposed only on the emission end face, it is convenient to package the active light sensor while an area of the right-angle prism film is reduced, thereby reducing costs.

Further, a separate rib is disposed between the sensing end face of the sensor and the emission end face of the light emitter, and the separate rib isolates the light emitted by the light emitter and the reflected light signal that is of the light and sensed by the sensor. The separate rib is opaque, to prevent the light emitted by the light emitter from entering the sensor and causing an error, which may cause an error and a failure of the active light sensor.

Further, a light concentration layer is disposed on the sensing end face of the sensor, and the light concentration layer is configured to aggregate the reflected light of the light emitted by the light emitter on the sensing end face such that the light enters the sensor, to ensure sensitivity and accuracy of the sensor.

In this embodiment, the backlight module includes a light homogenizing film stacked with the first prism film, a first through hole is disposed on the light homogenizing film, and the first through hole is used for light sensed and emitted by the active light sensor to pass through, to avoid impeding probe performance of the active light sensor. The light homogenizing film is attached to the first in-light surface of the first prism film. The light emitter and the sensor of the active light sensor face the first through hole.

In an embodiment, the backlight module includes a bottom frame, a second through hole is disposed on the bottom frame, and the second through hole is used for light sensed and emitted by the active light sensor to pass through. Specifically, the bottom frame is configured to carry another component, for example, an optical thin film such as the light guide plate, the reflector plate, the first prism film, and the second prism film of the backlight module. The second through hole is disposed on the bottom frame, and the second through hole is used for light sensed and emitted by the active light sensor to pass through. The bottom frame is made of an iron material, and is configured to support the light guide plate, the prism films, and the display screen. The light emitter and the sensor of the active light sensor face the second through hole. Certainly, the bottom frame of the backlight module may be omitted.

In addition to the light guide plate, the backlight module may further include one or all of the light homogenizing film, the reflector plate, and the bottom frame. When all of the plurality of functional layers are included, a hole needs to be provided only on the light homogenizing film and the bottom frame to change transmittance performance of the reflector plate such that the light sensed and emitted by the active light sensor can pass provided that the light emitter and the sensor face the through hole. The dimmer only needs to be located above a light emission direction of the light emitter. This structure is simple. The active light sensor is disposed on the backlight side of the backlight module, no through holes need to be disposed on the housing of the mobile phone, and the optical component does not need to provide an avoidance position for reserving a hole, thereby ensuring a real full-screen design of the terminal.

The reflector plate is made of one of polymethyl methacrylate, polycarbonate, and polyimide materials.

It may be understood that this embodiment of the present disclosure may further be considered as providing a backlight module. The backlight module includes a first prism film, a second prism film, a light guide plate, a reflector plate, and the like, and further includes the dimmer that is a right-angle prism film. The backlight module includes the backlight module in any one of the foregoing embodiments, and is applied to an optical device to cooperate with an active light sensor to implement a sensor design below a display screen, to achieve a full screen purpose. The backlight module is an independent element, and may be directly assembled with the active light sensor and the display screen.

An embodiment of the present disclosure further provides an electronic device, including the foregoing optical component and display screen. The light emitted by the light emitter of the active light sensor in the optical component is vertically emitted from the display screen under an action of the dimmer. A flexible line board is disposed on the optical component, and is configured to be electrically connected to a circuit board of the electronic device. Probe light of the light emitter of the active light sensor is emitted from a display surface of the optical component vertically. Reflected light of the probe light is received by the sensor such that the circuit board can control the terminal. The active light sensor in this embodiment is an optical proximity sensor, and is configured to implement screen on and locking.

According to the optical component provided in the present disclosure, the dimmer is disposed for the light emitted by the active light sensor, to implement probe light transmission, and the active light sensor is disposed below the display screen, and it is unnecessary to provide a hole or reserve a hole position in the housing of the terminal, thereby implementing a real full-screen design of the display screen.

BRIEF DESCRIPTION OF DRAWINGS

To describe the technical solutions in the embodiments of the present disclosure or in other approaches more clearly, the following briefly describes the accompanying drawings required for describing the embodiments or other approaches. Apparently, the accompanying drawings in the following description show merely some embodiments of the present disclosure, and a person of ordinary skill in the art may derive other drawings from these accompanying drawings without creative efforts.

DESCRIPTION OF EMBODIMENTS

Figure 1:
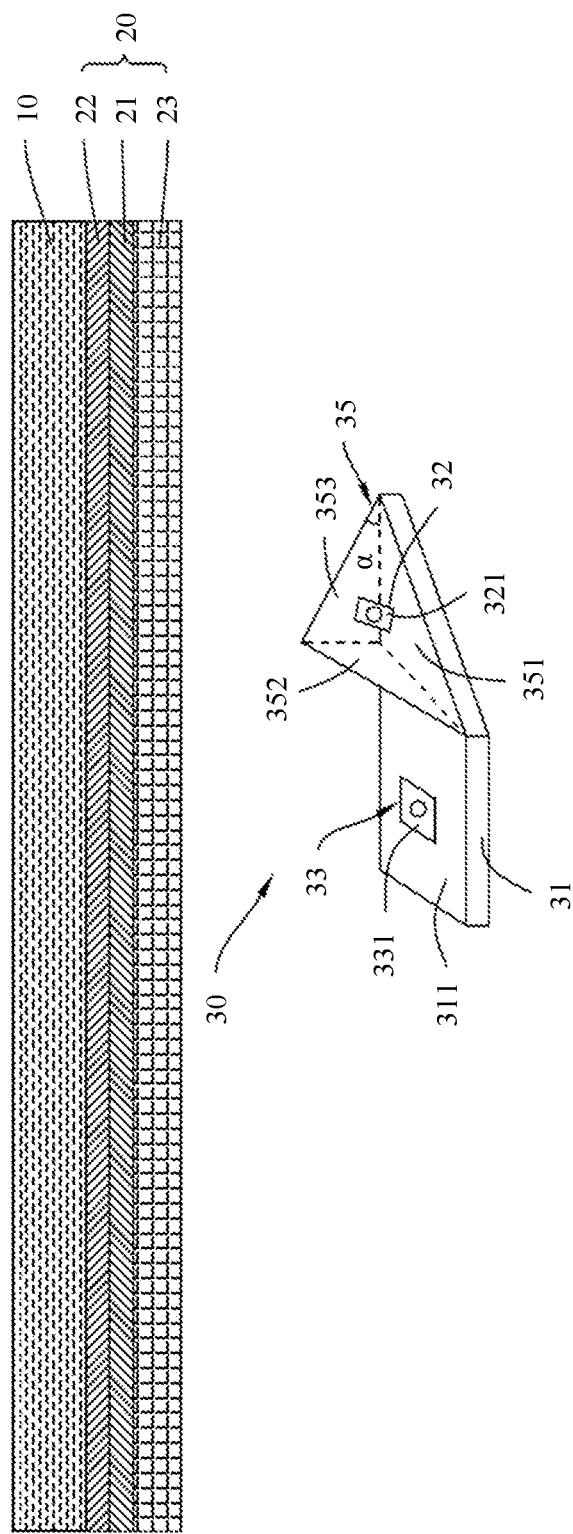
FIG. 1 is a schematic cross-sectional diagram of a full-screen optical component according to a first embodiment of the present disclosure.

The following clearly and completely describes the technical solutions in the embodiments of the present disclosure with reference to the accompanying drawings in the embodiments of the present disclosure. Apparently, the described embodiments are merely some rather than all of the embodiments of the present disclosure. All other embodiments obtained by a person of ordinary skill in the art based on the embodiments of the present disclosure without creative efforts shall fall within the protection scope of the present disclosure.

An embodiment of the present disclosure provides a full-screen optical component, applied to an electronic device such as a mobile phone. The electronic device includes a display screen. The optical component includes a backlight module, an active light sensor, and a dimmer. The display screen and the active light sensor are located on two opposite sides of the backlight module. The backlight module includes a first prism film and a second prism film stacked on the first prism film. The first prism film includes several parallel and spaced first prisms. The second prism film includes several spaced second prisms. A long axis of the first prism and a long axis of the second prism are perpendicular to each other. The first prism includes a first in-light surface and a first out-light surface. The second prism includes a second in-light surface and a second out-light surface. A display surface of the display screen, the first in-light surface, and the second in-light surface are disposed in parallel.

The active light sensor includes a sensor and a light emitter. The sensor is configured to sense a reflected light signal of light emitted by the light emitter. The dimmer is configured to direct the light emitted by the light emitter to the first in-light surface at a first incident angle such that the light is then emitted from the first out-light surface after being refracted by the first prism, is incident on the second in-light surface at a second incident angle, and is emitted from the second out-light surface after being refracted by the second prism such that the light passes through the display screen at a vertical angle. The first incident angle and the second incident angle are non-right angles.

Further, in a coordinate system in which a direction perpendicular to the display screen is a Z-axis, a long-axis direction of the first prism is a Y-axis, and a long-axis direction of the second prism is an X-axis, an origin of the coordinate system is located on incident light incident on the first prism film or an extension line of the light.

The dimmer enables that an included angle between the Z-axis and a projection of the light incident on the first in-light surface and on the second in-light surface on a plane of the X-Z axes is α, and that an included angle between the Z-axis and a projection of the light incident on the first in-light surface and on the second in-light surface on a plane of the Y-Z axes is α, where a meets the following relational expression $$\alpha = \arcsin\left(\eta \cos\left(\frac{\gamma}{2} + \arcsin\left(\frac{\cos\left(\frac{\gamma}{2}\right)}{\eta}\right)\right)\right),$$

where γ is a degree of a vertex angle of the first prism and the second prism, and η is a refractive index of a material of the first prism and the second prism.

In the optical component in this embodiment of the present disclosure, the dimmer is disposed on a backlight side of the display screen (a side backing onto the display surface, which may be on the backlight module or a backlight side of the backlight module), and emission light (probe light) of the active light sensor is incident on the prism films at a tilt angle using the dimmer, to ensure that the light of the active light sensor can pass through the backlight module and the display surface of the display screen, and ensure transmittance of passing through the prism films by the probe light. Therefore, the light is emitted vertically from the display screen, which ensures sensing performance of the active light sensor. It is unnecessary to reserve a position for a light passage hole between the display screen of the optical component and a housing, or additionally provide a light passage hole on the housing, to implement a real full-screen large screen form of the display surface. In addition, no holes can be seen on the appearance, which is conducive to an elegant appearance design.

The following describes the present disclosure using specific embodiments.

Referring to FIG. 1, a full-screen optical component of the present disclosure is applied to an electronic device such as a mobile phone, and the electronic device includes a display screen 10. The full-screen optical component (referred to as an optical component below) includes a backlight module 20, an active light sensor 30, and the dimmer. The display screen 10 and the active light sensor 30 are located on two opposite sides of the backlight module 20. The display screen 10 is stacked on a light emitting side of the backlight module 20, has a same length and a same width as the backlight module, and has a uniform thickness. It should be noted that only segments, of the backlight module and the display screen 10, corresponding to the active light sensor 30 are shown in the accompanying drawings of the embodiments of the present disclosure, and not all the segments are shown such that the active light sensor 30 has a large enough drawing for reference, that is, the figure does not represent a ratio of a complete display screen to the active light sensor 30.

Figure 2:
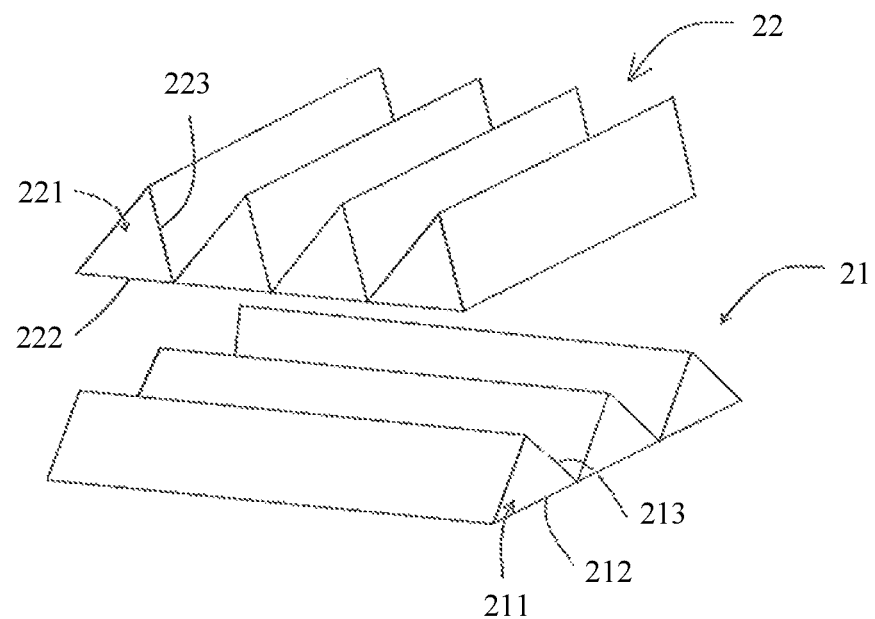
FIG. 2 is a schematic diagram of enlarged structures of a first prism film and a second prism film of the optical component shown in FIG. 1.

Referring to FIG. 2 together, the backlight module 20 includes a first prism film 21 and a second prism film 22 stacked on the first prism film 21. The first prism film 21 includes several first prisms 211 arranged in sequence and parallel, the second prism film 22 includes several second prisms 221 arranged in sequence and parallel, and a long axis of the first prism 211 and a long axis of the second prism 221 are perpendicular to each other. The first prism 211 includes a first in-light surface 212 and a first out-light surface 213, the second prism 221 includes a second in-light surface 222 and a second out-light surface 223, and a display surface of the display screen 10, the first in-light surface 212, and the second in-light surface 222 are disposed in parallel.

Specifically, the first prism 211 and the second prism 221 are isosceles triangles, and both include a vertex angle γ. The several first prisms 211 have a same length and parallel long axes, and long axes of the several second prisms 221 are parallel to each other and perpendicular to the long axes of the first prisms 211. Second in-light surfaces 222 of the several second prisms 221 are connected to form a plane, which may be understood as an in-light surface of the second prism film 22. First in-light surfaces 212 of the several first prisms 211 are connected to form a plane, which may be understood as an in-light surface of the first prism film 21. The backlight module 20 includes a light guide plate 23, the first prism film 21 and the second prism film 22 are stacked on a light emitting side of the light guide plate 23, the first in-light surface 212 faces the light guide plate 23, and the second in-light surface 222 faces the first prism film 21, specifically, faces a plane on which the vertex angle γ of the first prism 211 of the first prism film 21 is located.

Figure 3:
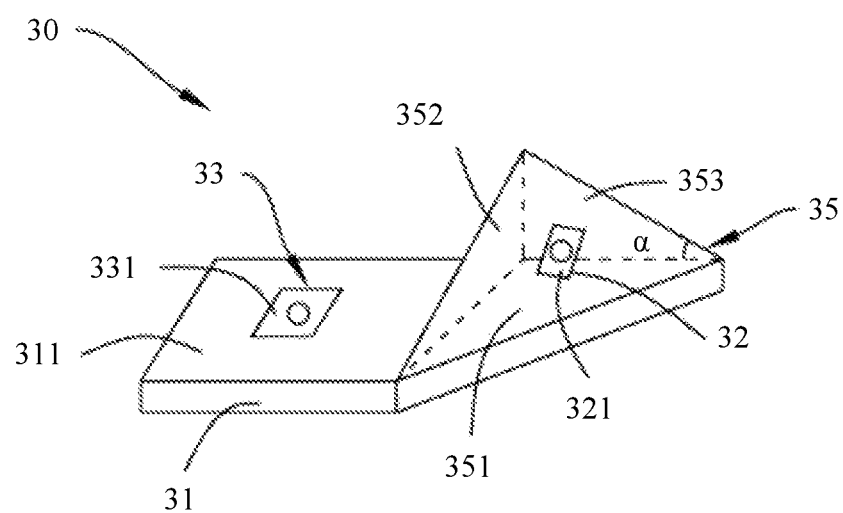
FIG. 3 is a schematic structural diagram of an active light sensor of the optical component shown in FIG. 1.

Referring to FIG. 3, the active light sensor 30 includes a sensor 33 and a light emitter 32, the electronic device includes a substrate, and the substrate may be a circuit board of the electronic device, or may be a line board of the active light sensor 30 for providing a conductive line for the sensor and the light emitter. In this embodiment, the substrate 31 is the line board of the active light sensor 30. The sensor 33 is configured to sense a reflected light signal of light (probe light) emitted by the light emitter 32, and the light sensed by the sensor 33 is sensed light. The active light sensor 30 includes an optical proximity sensor, a time of flight sensor, an iris recognition sensor, a dot matrix projector used for face recognition, a flood lighting device, and the like. In this embodiment, the active light sensor 30 is an optical proximity sensor. When the light emitted by the light emitter 32 is emitted from the display screen 10, reflected by a shielding object to the mobile phone, and sensed and received by the sensor 33, to generate a signal to a controller in a terminal, to assist the terminal in controlling the screen of the optical component to be on or off, to prevent the screen from being touched by accident in use.

In a first embodiment of the present disclosure, the substrate 31 includes an end face 311 parallel to the display surface of the display screen 10, and the dimmer 35 is protruded on the end face 311 and includes a bevel 351. The bevel 351 is connected to the end face 311 at an included angle α, and the light emitter 32 is located on the bevel 351 and emits light perpendicular to the bevel 351. The light emitter 32 includes a light emitting end face 321, and the light emitted by the light emitter 32 is emitted perpendicular to the light emitting end face 321. The light emitting end face 321 is parallel to the bevel 351.

The dimmer 35 is similar to a wedge-shaped protrusion. The dimmer 35 is directly protruded on the end face 311, or may be attached to the end face 311. The dimmer 35 includes the triangular bevel 351, a first side face 352, and a second side face 353. One edge of the bevel 351 is connected to the end face 311, and the first side face 352 and the second side face 353 are respectively connected to the two other edges of the end face 311 and the bevel 351. A connection line of the first side face 352 and the second side face 353 is used as a Z-axis, and edges extending along the end face are respectively an X-axis and a Y-axis. The included angle α faces the Z-axis and is an intersection point (origin of a coordinate system) of the X-axis and the Y-axis. Specifically, an included angle between the Y-axis and an intersection line of the bevel 351 and a YZ plane is the included angle α, and an included angle between the X-axis and an intersection line of the bevel 351 and an XZ plane is the included angle α. A tilt angle of the bevel of the dimmer in this embodiment is obtained as follows. On condition that light can pass vertically through the display screen 10, an incident angle is obtained based on a known degree of the vertex angle and refractive index of the first prism 211 and the second prism 221, and the tilt angle of the bevel can be directly designed based on the incident angle.

Figure 4:
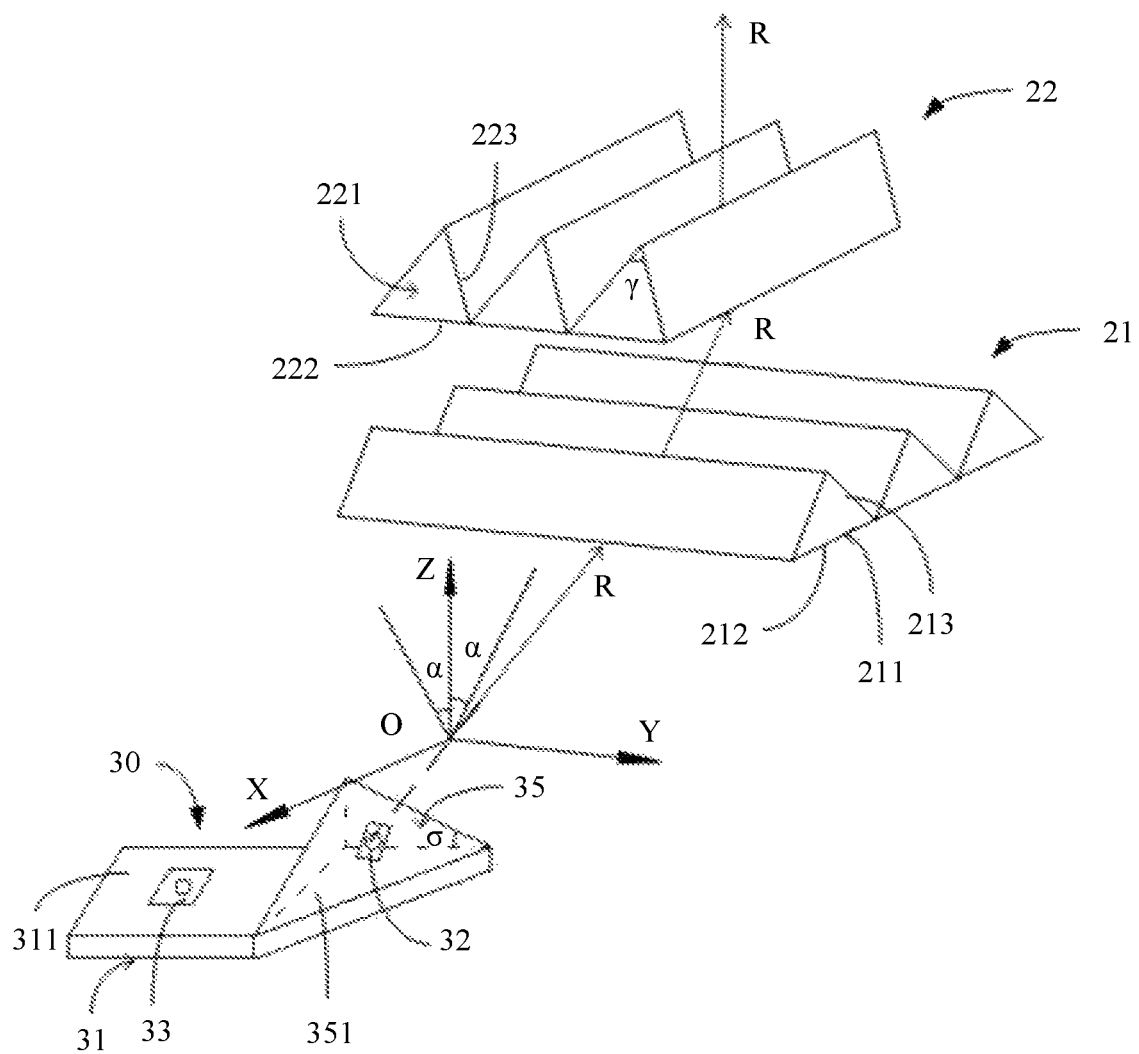
FIG. 4 is a schematic diagram of an optical path direction of the optical component shown in FIG. 1.

In this embodiment, referring to FIG. 4 together, the dimmer 35 directs light R emitted by the light emitter 32 to the first in-light surface 212 at a first incident angle (not shown in the figure). Then the light is refracted by the first prism 211 and emitted by the first out-light surface 213, is incident on the second in-light surface 222 directly at a second incident angle, and is refracted by the second prism 221 and emitted by the second out-light surface 223 such that the light R passes through the display screen 10 at a vertical angle, where the first incident angle is different from the second incident angle. It should be noted that, the vertical angle at which the light passes through the display screen allows a tolerance, for example, an angle deviation may be added to or subtracted from 90 degrees. Specifically, the light emitter 32 is located on the bevel 351 that is inclined at the included angle α relative to a horizontal surface, and emergent light is perpendicular to the bevel 351 such that the light emitted by the light emitter 32 can be incident at the first incident angle on the first in-light surface 212, and the light emitted by the light emitter 32 enters the prism films at a non-right angle, that is, the first prism film 21 and the second prism film 22. This prevents the light from being completely reflected by the prism films, ensuring that the light emitted by the light emitter 32 can pass through the backlight module 20 and the display screen 10, and has relatively high transmittance.

In this embodiment, the sensor 33 is mounted on the end face 311 of the substrate 31, and a photosensitive end face 331 of the sensor 33 is parallel to the end face 311 of the substrate 31. It may be understood that the end face 311 of the substrate 31 is the photosensitive end face 331, to ensure an effective receiving area of the sensor 33. In another manner, both the sensor 33 and the light emitter 32 are mounted on the bevel 351 of the dimmer 35, and the photosensitive end face 331 of the sensor 33 and the emission end face 321 of the light emitter 32 are disposed at an included angle relative to the end face 311 of the substrate 31. This structure may facilitate packaging of the active light sensor 30.

Further, the included angle α of the dimmer 35 in this embodiment meets the following condition. Specifically, in a coordinate system in which a direction perpendicular to the display screen 10 is a Z-axis, a long-axis direction of the first prism is a Y-axis, and a long-axis direction of the second prism is an X-axis, the long axis of the first prism 211 is parallel to the X-axis, and the long axis of the second prism 221 is parallel to the Y-axis. An origin O of the coordinate system is located on incident light incident on the first prism film 21 or an extension line of the light.

As shown in FIG. 4, the dimmer 35 enables that an included angle between the Z-axis and a projection of the light incident on the first in-light surface 212 and incident on the second in-light surface 222 through the first prism film 21 on a plane of the X-Z axes is α, and an included angle between the Z-axis and a projection of the light incident on the first in-light surface 212 and on the second in-light surface 222 on a plane of the Y-Z axes is α, where α meets the following relational expression $$\alpha = \arcsin\left(\eta\cos\left(\frac{\gamma}{2} + \arcsin\left(\frac{\cos(\frac{\gamma}{2})}{\eta}\right)\right)\right),$$

where γ is a degree of the vertex angle of the first prism 211 and the second prism 221, and η is a refractive index of a material of the first prism 211 and the second prism 221. The included angle between the Z-axis and the projection of the incident light on the plane of the X-Z axes is α, and the included angle between the Z-axis and the projection of the incident light on the plane of the Y-Z axes is α. A degree of the included angle α is calculated based on the first incident angle, the second incident angle, and the foregoing formula, where the degree of the included angle is a degree of the included angle α of the dimmer 35. The included angle α between the Z-axis and the projection of the incident light is first calculated using the formula, to satisfy that the included angle α between the bevel 351 of the dimmer 35 and the end face 311 can be designed for prisms with different degrees of vertex angles and reflective indexes, which is convenient for design and mass production.

Specifically, the X-axis is a short side direction of the display screen 10, the Y-axis is a long side direction of the display screen 10, and directions of the Z, X, and Y axes are all positive directions for example. A starting point of the incident light of the active light sensor 30 is the origin, and a degree of the included angle α is set based on the degree of the vertex angle and the refractive index of the first prism 211 and the second prism 221. Therefore, the degree of the included angle α may be calculated based on the known degree of the vertex angle and the refractive index of the first prism 211 and the second prism 221, to design, based on the included angle α, an actual angle of the light emitted by the light emitter 32. The included angle α of the bevel 351 of the dimmer 35 in this embodiment is the included angle α in this formula. It may be understood that, based on the foregoing formula, the included angle of the bevel of the dimmer 35 in this embodiment may be obtained. The corresponding actual angle of the light emitted by the light emitter 32 can be determined based on the degree of the vertex angle and the refractive index of the first prism 211 and the second prism 221, and the tilt angle of the bevel of the dimmer can be determined, to meet requirements of different liquid crystal displays. The dimmer in this embodiment has a simple structure and is easy to implement.

Figure 5:
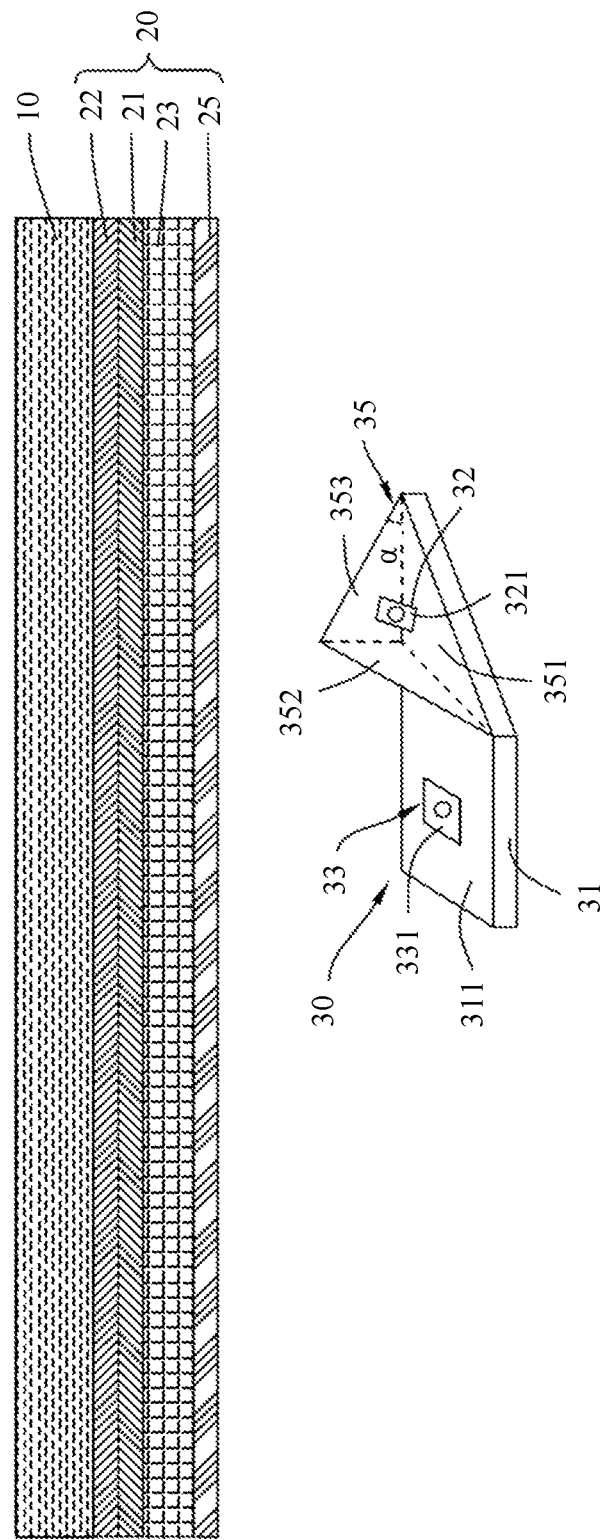
FIG. 5 is a schematic diagram of a backlight module that is of the optical component shown in FIG. 1 and includes a reflector plate.

In an embodiment, as shown in FIG. 5, the backlight module 20 includes the light guide plate 23 and the reflector plate 25 that are stacked with the first prism film 21. The first prism film 21 and the reflector plate 25 are respectively stacked on a light emitting side and an opposite side of the light emitting side of the light guide plate 23, and the first in-light surface 212 faces the light emitting side. The reflector plate 25 is configured to reflect visible light and transmit infrared light, to implement that the light emitted by the light emitter 32 passes through the reflector plate 25 without being shielded. Specifically, the reflector plate 25 is made of any material of polymethyl methacrylate, polycarbonate, or polyimide, and is configured to, in the backlight module 20, reflect, to the light guide plate, light that is from visible light of a light source and exposed to the bottom, to improve light use efficiency, and transmit infrared light. That is, the light emitted by the light emitter 32 is infrared light.

Figure 6:
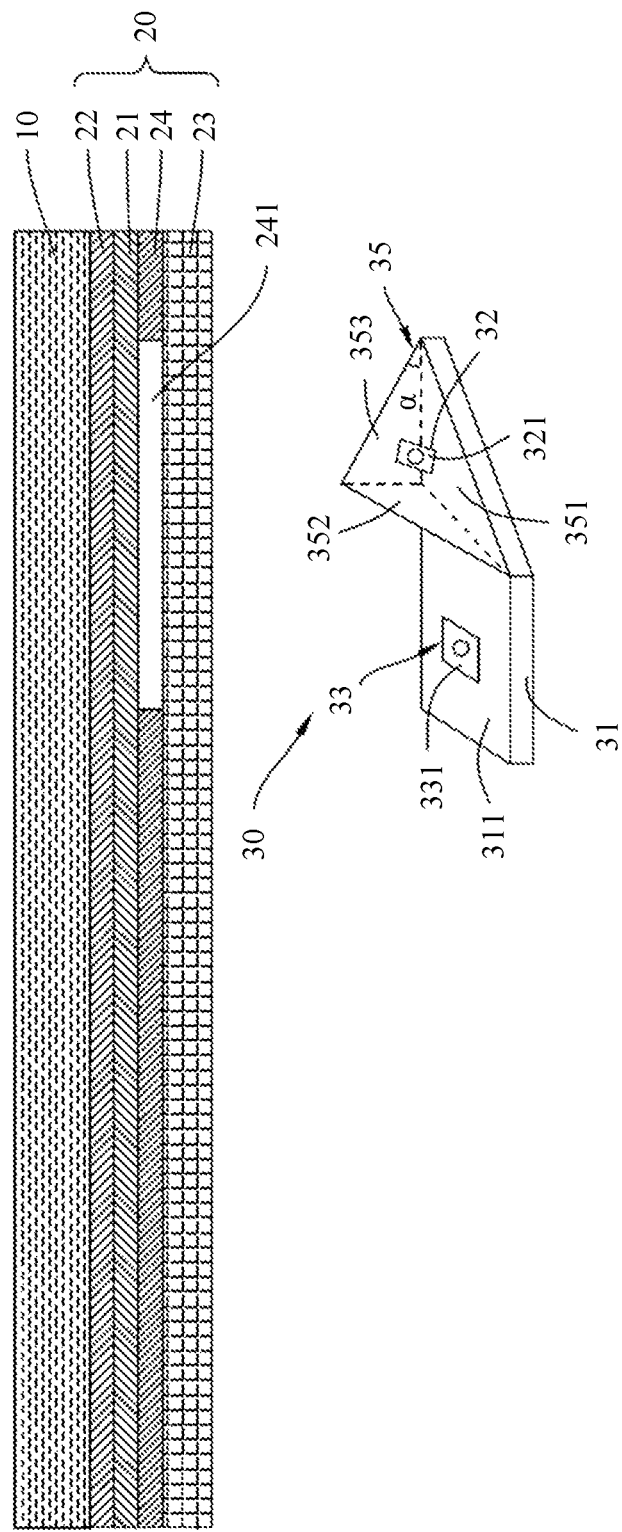
FIG. 6 is a schematic diagram of a backlight module that is of the optical component shown in FIG. 1 and includes a light homogenizing film.

In another implementation of this embodiment, as shown in FIG. 6, the backlight module 20 includes a light homogenizing film 24 stacked with the first prism film 21, a first through hole 241 is disposed on the light homogenizing film 24, and the first through hole 241 is used for light sensed and emitted by the active light sensor 30 to pass through, to avoid impeding probe performance of the active light sensor 30. The light homogenizing film 241 is attached to the first in-light surface 212 of the first prism film 21 and is located on the light emitting side of the light guide plate 23. The active light sensor 30 is located on a backlight side of the display screen 10. In this embodiment, the active light sensor 30 is located on a backlight side of the backlight module 20 (a side backing onto the display screen). The light emitter 32 and the sensor 33 face the first through hole 241. The first through hole 241 is located in the backlight module 20 instead of being located outside a liquid crystal display, and does not affect a screen-to-body ratio of a display panel. Specifically, the light homogenizing film 24 has a function of diffusing light, that is, light is scattered on a surface of the light homogenizing film 24, and the light is gently and evenly spread out. The light homogenizing film 24 is configured to homogenize light of the backlight module 20 to ensure even brightness of the display screen.

Figure 7:
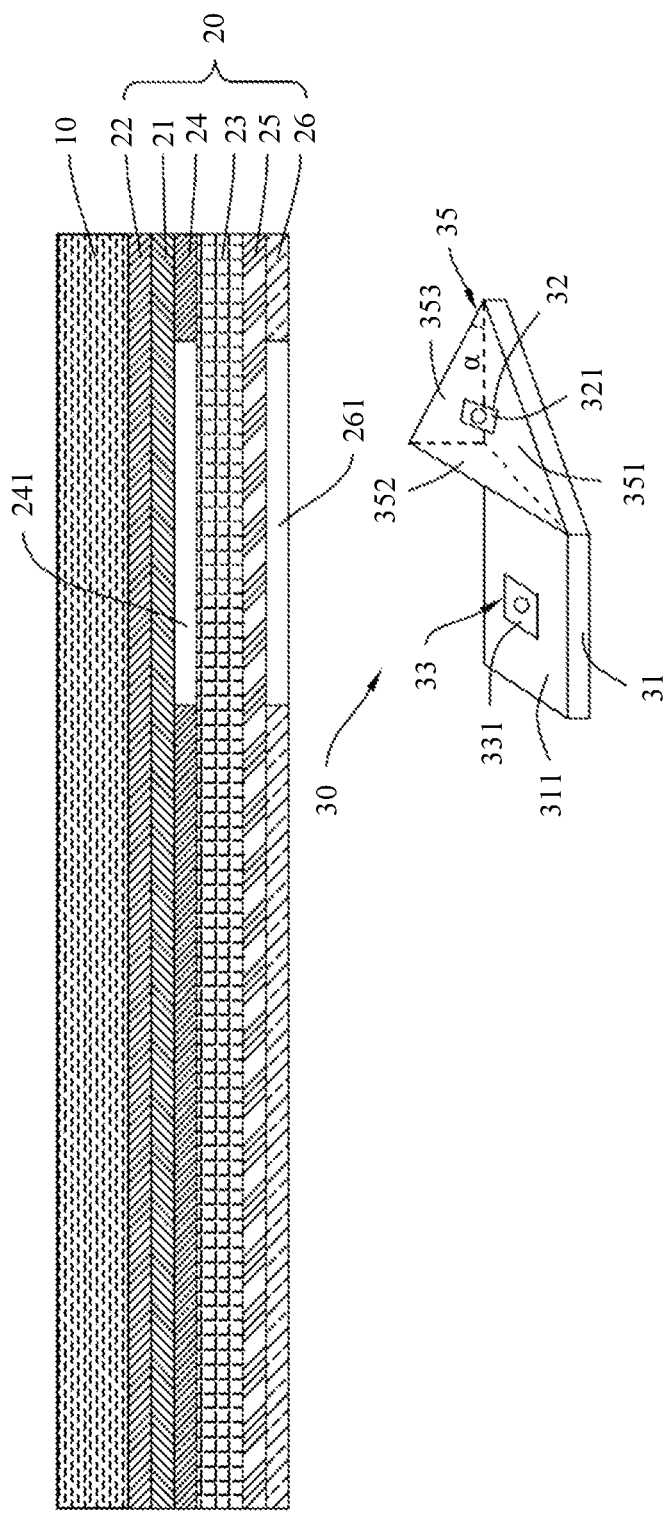
FIG. 7 is a schematic diagram of a backlight module that is of the optical component shown in FIG. 1 and includes a reflector plate, a light homogenizing film, and a bottom frame.

In a third implementation of this embodiment, as shown in FIG. 7, the backlight module 20 includes a bottom frame 26, a second through hole 261 is disposed on the bottom frame 26, and the second through hole 261 is used for the light sensed and emitted by the active light sensor 30 to pass through. The bottom frame 26 is made of an iron material, and is configured to support the display screen 10 and an optical film such as the light guide plate of the backlight module. The light emitter 32 and the sensor 33 of the active light sensor 30 face the second through hole 261. Certainly, the bottom frame 26 of the backlight module 20 may be omitted. When the light homogenizing film 24 is disposed in the backlight module, the first through hole 241 is coaxially opposed to the second through hole 261. Further, in addition to the light guide plate and the reflector plate, one or both of the light homogenizing film and the bottom frame may be included. When all of the light guide plate 23, the reflector plate 25, the light homogenizing film 24, and the bottom frame 26 are included, a hole needs to be provided only on the light homogenizing film 24 and the bottom frame 26 to change transmittance performance of the reflector plate 25. The active light sensor 30 is opposite to the through hole such that the light sensed and emitted by the active light sensor 30 can pass provided that the sensor 33 and the light emitter 32 are opposite to the through hole. The dimmer 35 only needs to be located above a light emission direction of the light emitter 32. This structure is simple. The active light sensor 30 is disposed on the backlight side of the display screen 10. It is unnecessary to provide a through hole on the housing of the terminal, or to provide an avoidance position for reserving a hole on the display screen 10 and the backlight module 20, to increase the screen-to-body ratio of the display screen, and ensure a real full-screen design of the terminal.

Figure 8:
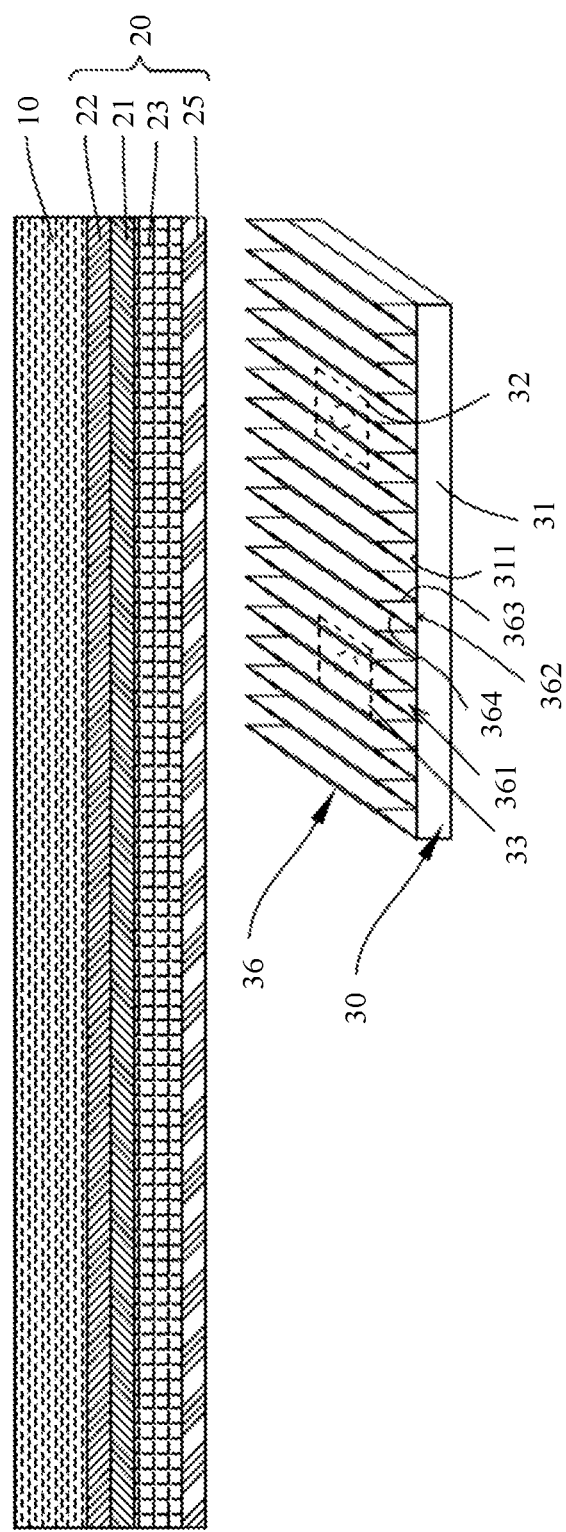
FIG. 8 is a schematic cross-sectional diagram of a full-screen optical component according to a second embodiment of the present disclosure.
Figure 9:
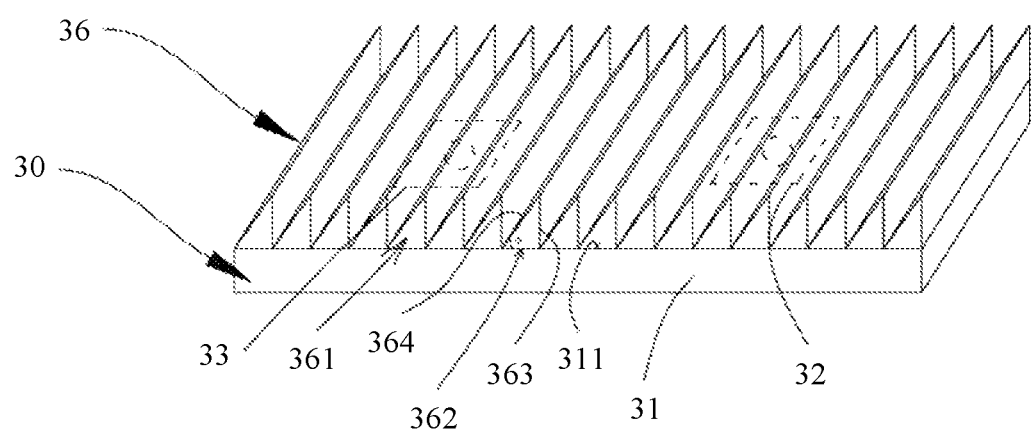
FIG. 9 is a schematic structural diagram of assembling an active light sensor and a dimmer of the optical component shown in FIG. 8.

Referring to FIG. 8 and FIG. 9, in a second embodiment of the present disclosure, different from the foregoing, the light emitter 32 and the sensor 33 of the active light sensor 30 are located on the end face of the substrate 31, and the light emitter 32 emits light perpendicular to the end face. The dimmer 36 is a right-angle prism film, including several right-angle prisms 361 disposed in sequence and parallel, and long axes of the several right-angle prisms 361 are perpendicular to an angle bisector of the X-axis and the Y-axis (in this embodiment, an angle bisector in a positive direction of the X-axis and the Y-axis is used as an example). That is, the several right-angle prisms 361 are arranged along an extension direction of an angle bisector P of the included angle between the long axis of the first prism 211 and the long axis of the second prism 221. Bottom surfaces 362 of the several right-angle prisms 361 are parallel to the display surface of the display screen 10. The light emitted by the light emitter 32 of the active light sensor 30 is incident at a right angle on the bottom surface 362 of the right-angle prism 361, is emitted from a right-angle surface 363 of the right-angle prism 361, and is directly incident on the first in-light surface 212. An extension direction of the right-angle surface 363 is perpendicular to the first in-light surface 212, and an emergent angle between the light and the right-angle surface 363, that is, an emergent angle of an included angle between the light and the Z-axis, is the same as the first incident angle. The backlight module 20 shown in FIG. 8 is an implementation of this embodiment.

As shown in FIG. 9, specifically, the several right-angle prisms 361 have a same length, and a same included angle between a bevel 364 and the bottom surface 363. The long axes of the several right-angle prisms 361 are arranged in sequence and parallel and are perpendicular to the angle bisector P. The bottom surfaces 362 of the several right-angle prisms 361 are sequentially connected to form a bottom surface of the right-angle prism film, and the light emitted by the light emitter 32 is incident on the bottom surface of the right-angle prism film at a right angle, specifically, the bottom surface 362 of each right-angle prism 361. The bottom surface 362 faces the end face 311 of the substrate 31 of the active light sensor 30. In this embodiment, through deflection of light in the right-angle prism 361, inclined light is emitted, and an emergent angle is formed such that the light emitted by the light emitter 32 enters the prism films at a non-right angle, to prevent the light from being completely reflected by the prism films, and ensure that the light can pass through the backlight module 20 and the display screen 10 and has relatively high transmittance, thereby further ensuring sensitivity of the active light sensor 30. In this embodiment, the right-angle prism film is made of a polyethylene terephthalate material.

Figure 10:
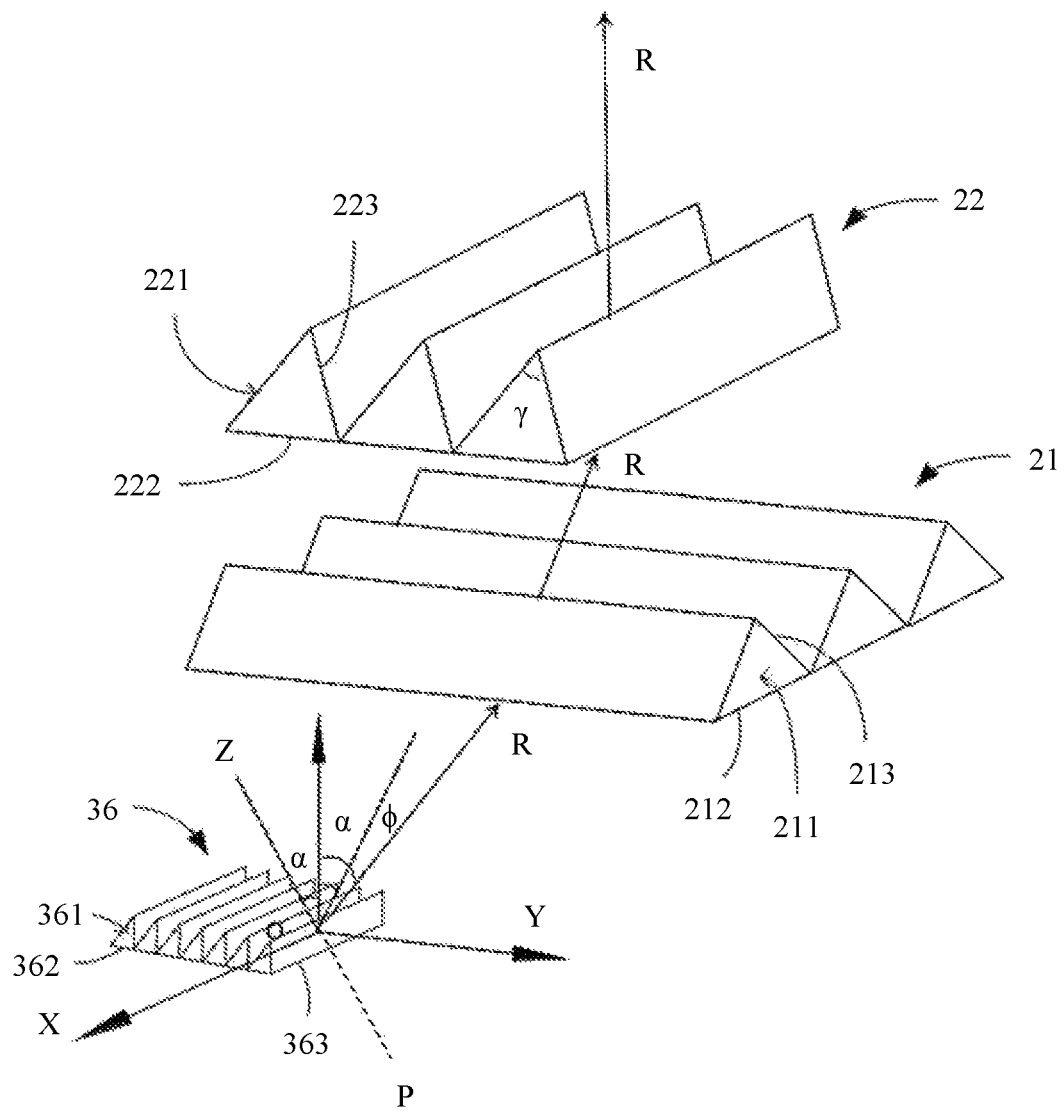
FIG. 10 is a schematic diagram of an optical path direction of the optical component shown in FIG. 8.

Referring to FIG. 9 and FIG. 10, in this embodiment, an included angle between the bevel 264 of the right-angle prism 361 and the bottom surface 362 is θ, n is a refractive index of the right-angle prism 361, the light is emitted from the right-angle surface 363, and an emergent angle between the light and the right-angle surface 363 is φ. The included angle θ meets the following formula θ=(a sin(cos (φ)/n)+π/2)/2.

A degree value of the included angle θ of the dimmer 36 in this embodiment can be obtained using the known vertex angle and refractive index of the first prism 211 and the second prism 221, and under a known condition that the light passes through the display screen 10 vertically. The emergent angle φ is the same as the first incident angle.

In this embodiment, the angle φ meets φ=a tan(√2 tan α), and α may be obtained based on the following relational expression $$\alpha = \arcsin\left(\eta\cos\left(\frac{\gamma}{2} + \arcsin\left(\frac{\cos(\frac{\gamma}{2})}{\eta}\right)\right)\right).$$

That is, after the light emitted by the light emitter 32 is incident on the right-angle prism 361 at a right angle, a vertex of an included angle between the light and the right-angle surface 363 is the origin O, an included angle between the Z-axis and a projection of the light emitted from the right-angle surface 363 on the plane of the X-Z axes is α, and an included angle between the Z-axis and a projection of the light on the plane of the Y-Z axes is α. That is, a degree of the included angle α is calculated based on the refractive index and the degree of the vertex angle of the first prism 211 and the second prism 221 and the foregoing formula, to determine the emergent angle φ of the dimmer 36. The included angle θ between the bevel 364 of the right-angle prism 361 and the bottom surface 362 is determined based on θ=(a sin(cos (φ)/n)+π/2)/2, to design the included angle θ between the bevel and the bottom surface for right-angle prisms with different refractive indexes.

Further, referring to FIG. 9, in an implementation of assembling the dimmer 36 and the active light sensor 30 in this embodiment, the dimmer 36 is stacked on an emission end face of the light emitter 32 and a sensing end face of the sensor 33, and the emission end face and the sensing end face are located on a same horizontal plane. The sensing end face of the sensor 33 is located on the same plane as the emission end face, that is, the dimmer 36 is directly disposed on an operating end face of the active light sensor 30, which is flat and facilitates packaging of the active light sensor 30. Specifically, the light emitting end face of the light emitter 32 of the active light sensor 30 and the sensing end face of the sensor 33 are coplanar with each other and are parallel to the display surface of the display screen 10 such that the end face 311 of the substrate can be protruded, or the light emitting end face of the light emitter 32 of the active light sensor 30 and the sensing end face of the sensor 33 are flush with the end face 311. In another manner, when the dimmer 36 is stacked on the emission end face of the light emitter 32, the sensing end face of the sensor 33 does not need the dimmer 36 such that an area of the dimmer 36 can be reduced, and manufacturing costs can be reduced. In this manner, the sensor 33 may also be tilted.

Figure 11:
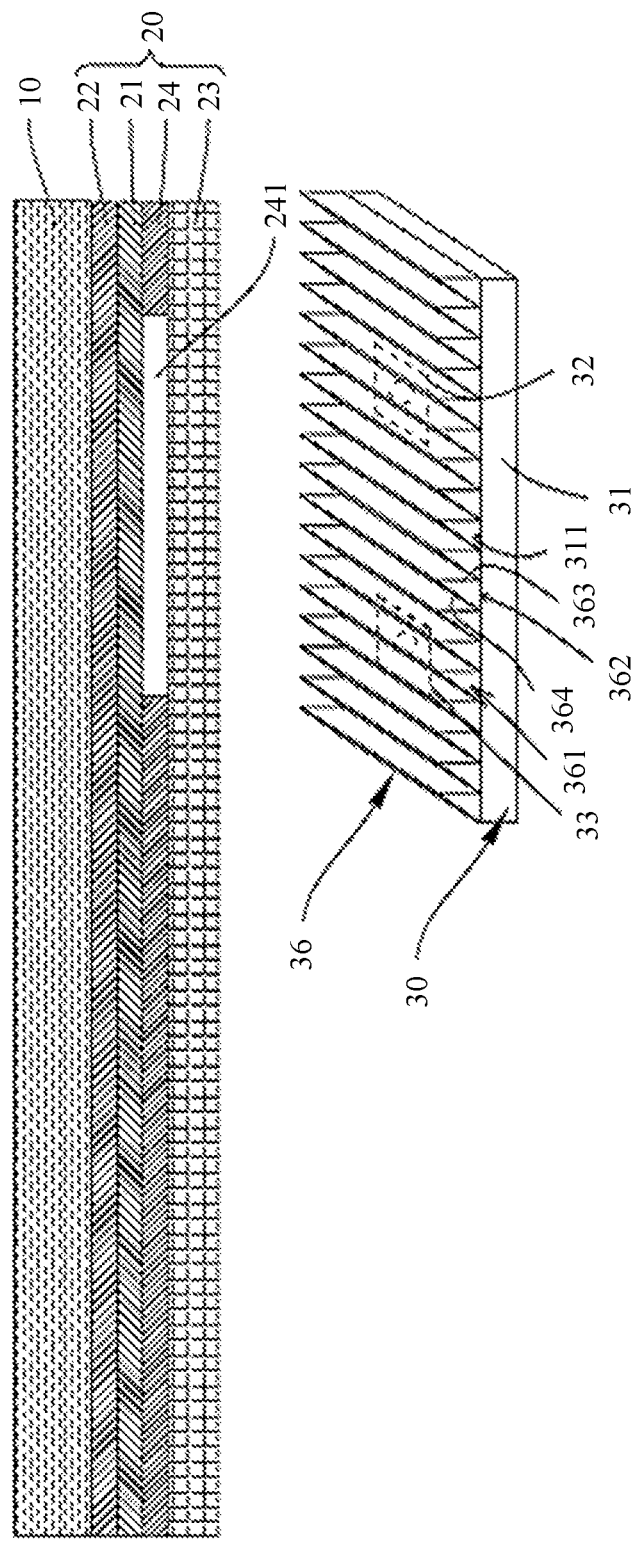
FIG. 11 is a schematic diagram of a backlight module that is of the optical component shown in FIG. 8 and includes a light homogenizing film.
Figure 12:
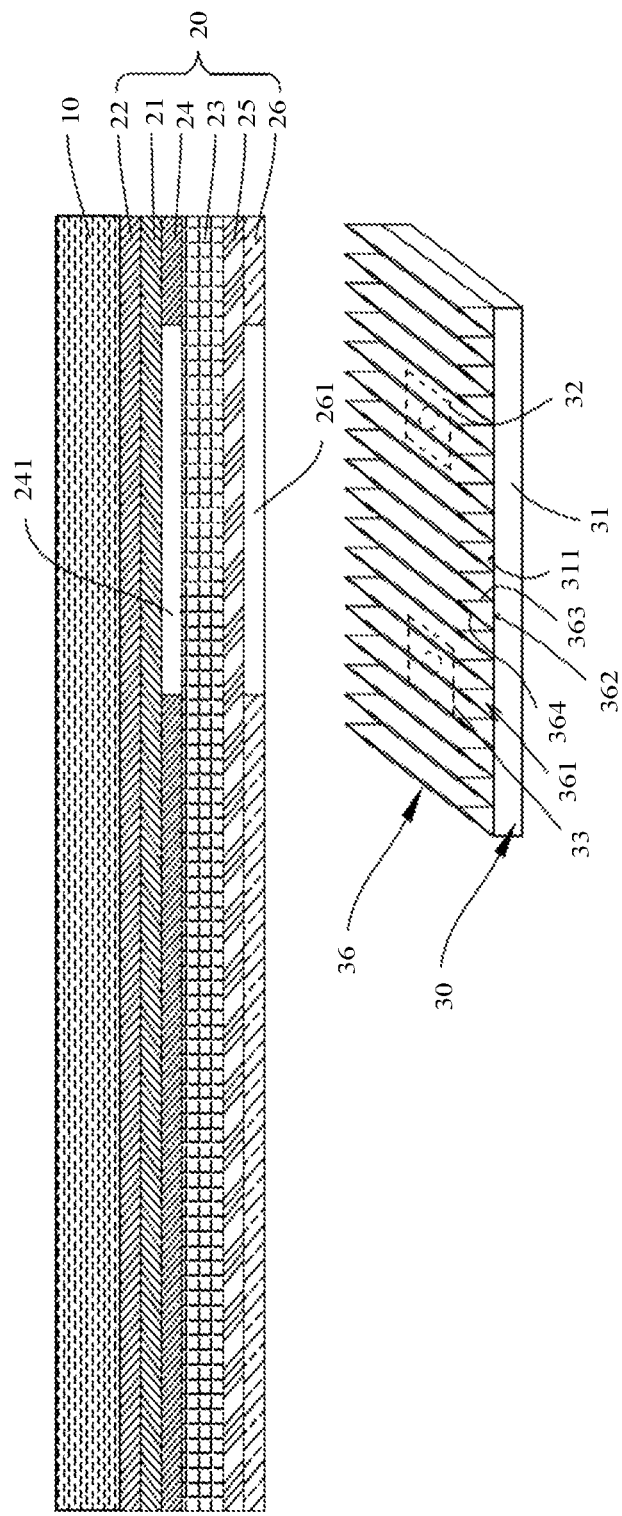
FIG. 12 is a schematic diagram of a backlight module that is of the optical component shown in FIG. 8 and includes a reflector plate, a light homogenizing film, and a bottom frame.

Refer to FIG. 11, which is a schematic diagram of cooperation between the active light sensor 30 equipped with the dimmer 36 shown in FIG. 9 and the backlight module 20 including the light homogenizing film 24. All vertex angles of the dimmer 36 that is a right-angle prism film face the backlight side of the backlight module 20 and are opposite to the first through hole 241, and the light emitting end face of the light emitter 32 is laminated on the bottom surface 362 of the right-angle prism 361. Refer to FIG. 12, which is a schematic diagram of cooperation between the active light sensor 30 equipped with the dimmer 36 in the embodiment shown in FIG. 9 and the backlight module 20 including the light homogenizing film 24, the reflector plate 25, and the bottom frame 16. All vertex angles of the dimmer 36 face the backlight side of the backlight module 20 and are opposite to the first through hole 241 and the second through hole 261. The light emitting end face of the light emitter 32 is laminated on the bottom surface 362 of the right-angle prism 361.

Figure 13:
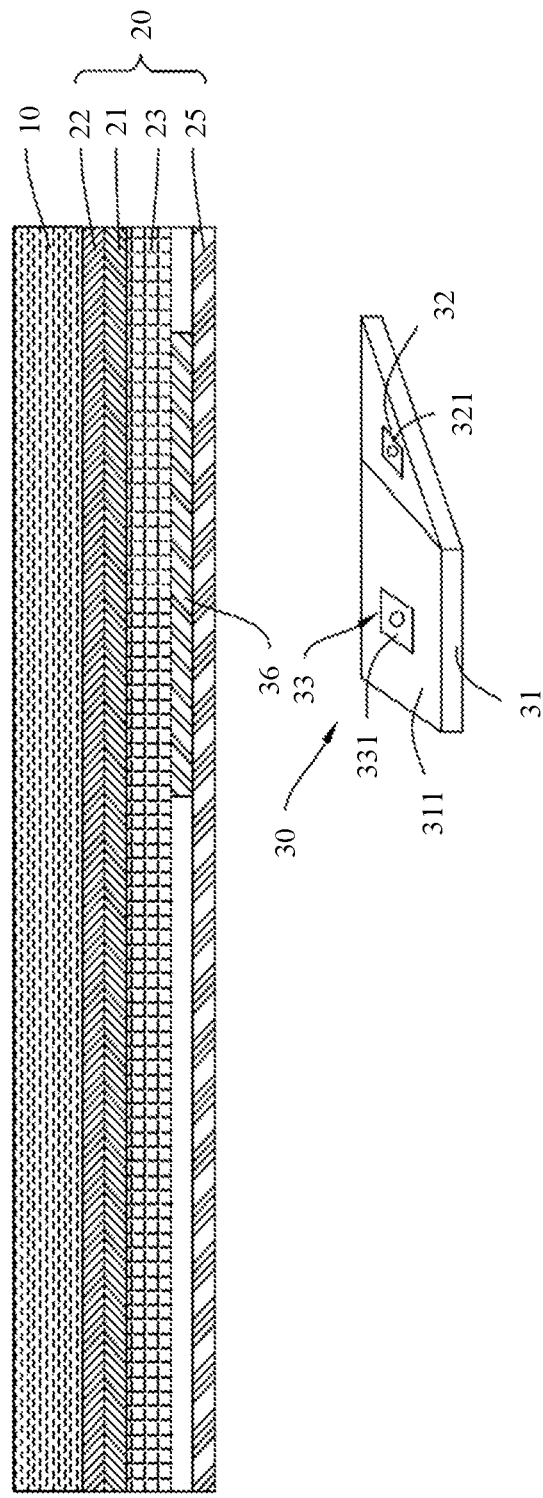
FIG. 13 is a schematic cross-sectional diagram of an implementation of assembling a dimmer and a backlight module of the optical component shown in FIG. 8.

Refer to FIG. 13, which is a first implementation of assembling the dimmer 36 to the backlight module 20. The active light sensor 30 is disposed on the backlight side of the backlight module 20 and is opposite to the dimmer 36, the backlight module 20 includes the light guide plate 23 and the reflector plate 25, and the dimmer 36 is stacked between the light guide plate 23 and the reflector plate 25. The bottom surface 362 of the dimmer 36 is laminated on a surface that is of the reflector plate 25 and faces the light guide plate 23, and a side of the vertex angle of the dimmer 36 is connected to a side opposite to the light emitting side of the light guide plate 23. Alternatively, the dimmer 36 is stacked on a surface that is of the reflector plate 25 and opposite to the light guide plate 23 (not shown in the figure). In this embodiment, the dimmer 36 is stacked between the light guide plate 23 and the reflector plate 25 such that infrared light of the active light sensor 30 can directly pass through the reflector plate 25 to enter the light guide plate 23 and the prism films (the first prism film and the second prism film). Therefore, the infrared light of the active light sensor 30 is not affected by the reflector plate 25, it is unnecessary to reserve a hole position on the housing of the mobile phone to pass light, and a manufacturing process is simple. In this implementation, when the backlight module 20 further includes the light homogenizing film 24, the dimmer 36 is disposed opposite to the first light passage hole 241 such that light can enter and exit through the first light passage hole 241, thereby avoiding being shielded by the light homogenizing film 24.

Figure 14:
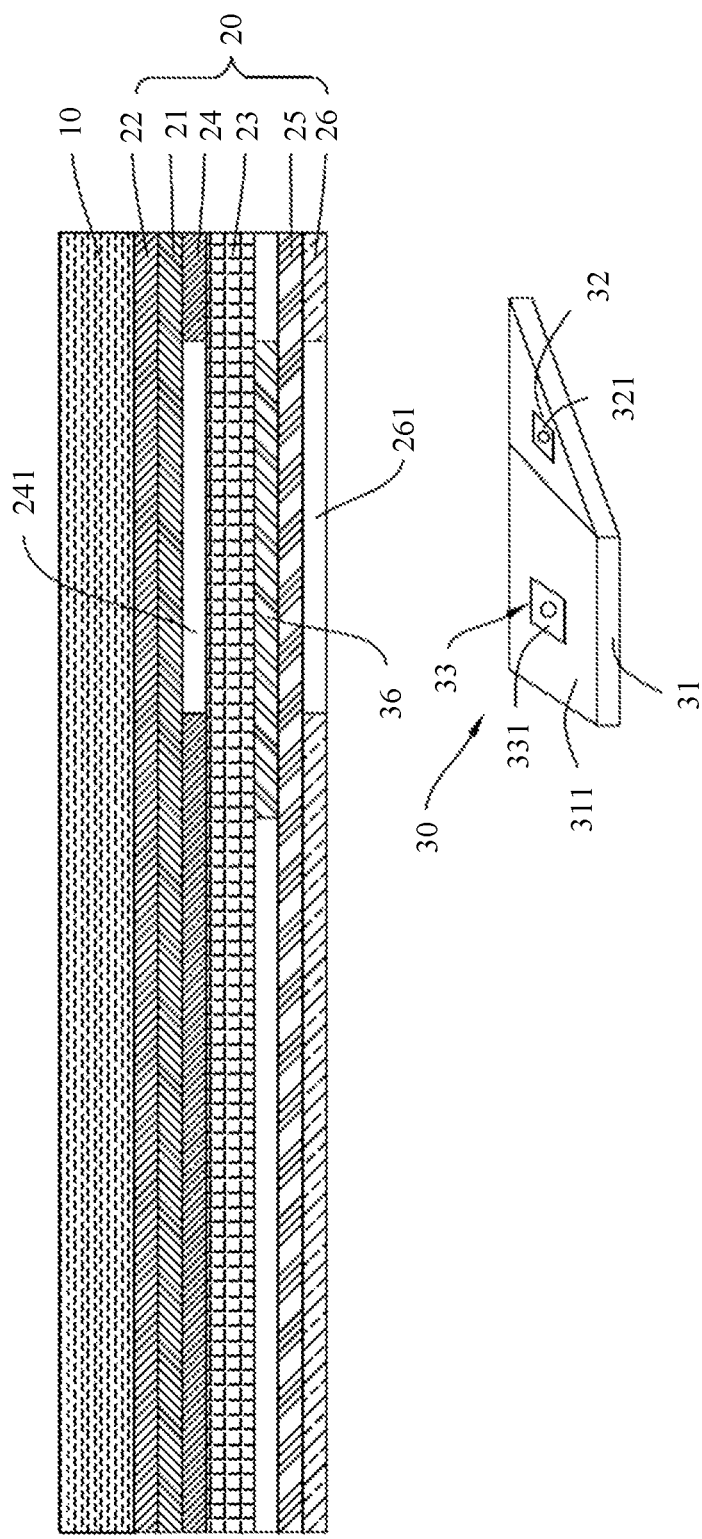
FIG. 14 is a schematic cross-sectional diagram of another implementation of assembling a dimmer and a backlight module of the optical component shown in FIG. 8.

In another implementation, as shown in FIG. 14, when the backlight module 20 further includes the bottom frame 26 and the light homogenizing film 24, the dimmer 36 is sandwiched between the light guide plate 23 and the reflector plate 23, and the active light sensor 30 is disposed opposite to the first light passage hole 241 and the second through hole 261 such that the infrared light of the active light sensor 30 can directly pass through the second through hole 261 to enter the reflector plate 25 and the light guide plate 23, and enter the prism films (the first prism film and the second prism film) through the first light passage hole 241. Therefore, the infrared light of the active light sensor 30 is not affected by the bottom frame 26 and the light homogenizing film 24. Factors such as an elegant appearance and a screen-to-body ratio do not need to be considered in a manufacturing process, which is simple.

In the foregoing two implementations, the emission end face of the light emitter 32 of the active light sensor 30 is parallel to the display surface of the display screen 10, and faces the dimmer 36. The sensing end face of the sensor 33 and the emission end face of the light emitter 32 are located on the same plane or disposed obliquely. In this embodiment, the sensing end face of the sensor 33 is located on the same plane as the emission end face of the light emitter 32. In this embodiment, the dimmer is directly disposed in the backlight module without changing a structure of the active light sensor 30, thereby further ensuring light transmission stability. Further, the dimmer 36 is disposed only on the emission end face of the light emitter 32, which can reduce an area of the dimmer 36 and reduce costs.

Further, a separate rib (not shown in the figure) is disposed between the sensing end face of the sensor 33 and the emission end face of the light emitter 32, and the separate rib isolates the light emitted by the light emitter 32 and the reflected light signal that is of the light and sensed by the sensor 33. The separate rib is opaque, to prevent the light emitted by the light emitter 32 from entering the sensor 33 and causing an error, which may cause an error and a failure of the active light sensor 30.

Further, a light concentration layer (not shown in the figure) is disposed on the sensing end face of the sensor 33, and the light concentration layer is configured to aggregate the reflected light of the light emitted by the light emitter on the sensing end face such that the light enters the sensor 33, to ensure sensitivity and accuracy of the sensor 33.

Further, a flexible line board is disposed on the optical component in the foregoing embodiment, and is configured to be electrically connected to the circuit board of the terminal. The flexible line board is bent and hidden on the backlight side of the backlight module 20, and the active light sensor 30 may be mounted on the flexible line board and electrically connected to the flexible line board, or the flexible line board is directly used as the substrate. Certainly, the active light sensor 30 may alternatively be mounted on the circuit board of the terminal and electrically connected to the circuit board, or the circuit board is directly used as the substrate.

Figure 15:
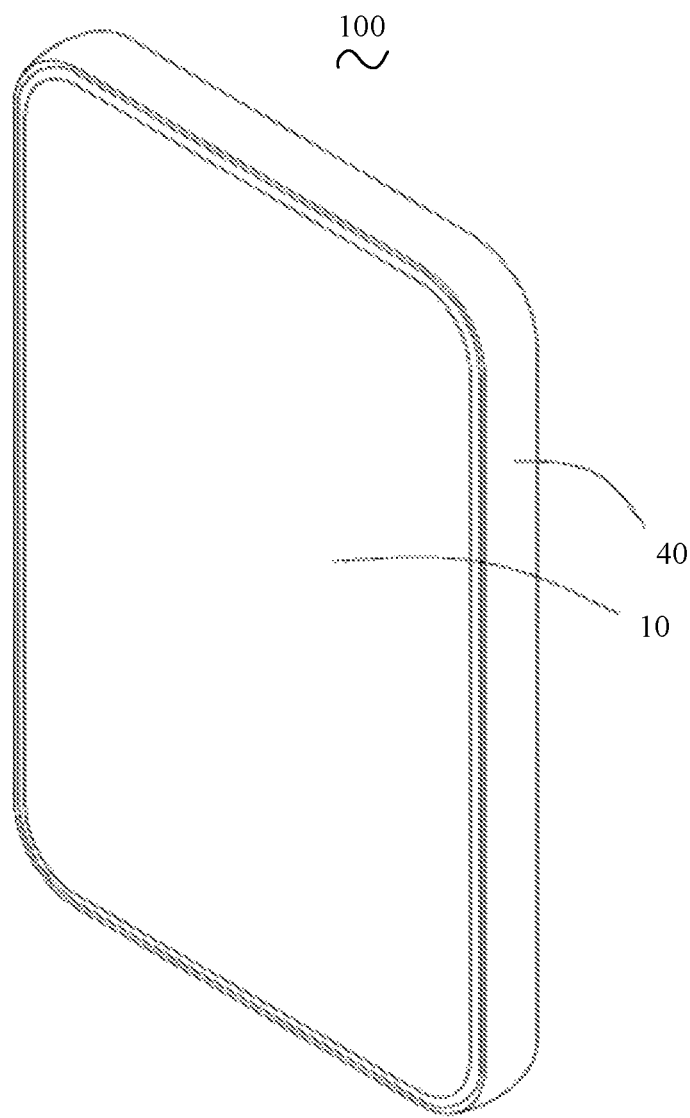
FIG. 15 is a schematic structural diagram of an electronic device including a full-screen optical component according to an embodiment of the present disclosure.

Referring to FIG. 15, an embodiment of the present disclosure further provides an electronic device 100, including the foregoing optical component and display screen 10. The electronic device 100 in this embodiment is a mobile phone. The light emitted by the light emitter 32 of the active light sensor 30 in the optical component is vertically emitted from the display screen 10 under an action of the dimmer. Certainly, the vertical angle at which the light is emitted from the display screen 10 under the action of the dimmer includes an existing angle tolerance. Specifically, the electronic device includes a housing, and the housing surrounds a peripheral side of the display screen 10 such that the entire display surface of the display screen 10 is presented to implement a full-screen mode. The light emitted by the light emitter 32 is vertically emitted from the display surface of the optical component, and is reflected by an external shielding object to be received by the sensor 33, to implement control by the circuit board on the terminal. The active light sensor 30 in this embodiment is an optical proximity sensor, and is configured to implement screen on and locking. The electronic device may be a mobile phone with a touchscreen.

According to the optical component provided in the present disclosure, the active light sensor 30 is disposed on the backlight side of the display screen 10, and may also be considered as being located below the display screen, instead of being located on a side of the display screen, and no hole is provided on the display screen to allow light emitted and received by the active light sensor 30 to pass through. The dimmer is disposed to adjust an angle of the light emitted by the active light sensor 30 such that infrared light used for detection can pass through the backlight module and the display screen, and a real full-screen design is implemented without a need to provide a hole or reserve a hole position on the housing.

What is claimed is:

1. A full-screen optical component comprising:
    a backlight system comprising:
        a first side, wherein a display screen, of an electronic device, comprising a display surface is located on the first side;
        a second side;
        a first prism film comprising a plurality of first prisms disposed in parallel, wherein each first prism comprises:
            a first in-light surface configured to dispose in parallel to the display surface; and
            a first out-light surface; and
        a second prism film stacked on the first prism film and comprising a plurality of second prisms disposed in parallel, wherein each second prism comprises:
            a second in-light surface configured to dispose in parallel to the display surface; and
            a second out-light surface, wherein a second long axis of a second prism is perpendicular to a first long axis of a first prism;
    an active light sensor located on the second side and comprising:
        a light emitter configured to emit light; and
        a sensor configured to sense a reflected light signal of the light; and
    a dimmer coupled to the backlight system and configured to direct the light to the first in-light surface at a first incident angle inclined relative to a vertical direction, such that the light is then emitted from the first out-light surface after being refracted by the first prism, enters the second in-light surface at a second incident angle inclined relative to the vertical direction, and is emitted from the second out-light surface after being refracted by the second prism, such that the light passes through the display screen at a vertical angle.

2. The full-screen optical component of claim 1, wherein a direction perpendicular to the display screen is a Z-axis, the first long axis is a Y-axis, and the second long axis is an X-axis in a coordinate system, wherein an origin of the coordinate system is located on incident light on the first prism film or an extension line of the light, wherein the dimmer is further configured to enable an included angle α, between the Z-axis and a projection of the light incident on the first in-light surface on an X-Z plane or on a Y-Z plane, calculated as follows:

$$\alpha = \arcsin\left(\eta \cos\left(\frac{\gamma}{2} + \arcsin\left(\frac{\cos\left(\frac{\gamma}{2}\right)}{\eta}\right)\right)\right),$$

wherein γ is a degree of a vertex angle of the first prism and the second prism, and wherein η is a refractive index of a material of the first prism and the second prism.

3. The full-screen optical component of claim 2, wherein the dimmer is a right-angle prism film comprising a plurality of right-angle prisms disposed parallelly in sequence, wherein a long axis of a first right-angle prism of the right-angle prisms is perpendicular to an angle bisector of the X-axis and the Y-axis, wherein a bottom surface of the first right-angle prism is parallel to the display surface, wherein the light is incident at a right-angle on the bottom surface and is emitted from a right-angle surface of the first right-angle prism, wherein the light is directly incident on the first in-light surface, wherein an extension direction of the right-angle surface is perpendicular to the first in-light surface, and wherein an emergent angle between the light and the right-angle surface is the same as the first incident angle.

4. The full-screen optical component of claim 3, wherein an included angle between a bevel of the first right-angle prism and the bottom surface is θ calculated as follows:

$$\theta = (a\sin(\cos(\varphi)/n) + \pi/2)/2,$$

wherein φ is a degree of the emergent angle, and wherein n is a refractive index of the first right-angle prism.

5. The full-screen optical component of claim 3, wherein the light is perpendicular to an X-Y plane, and wherein the bottom surface is parallel to the X-Y plane and is located on the light emitter.

6. The full-screen optical component of claim 3, wherein the right-angle prism film is made of a polyethylene terephthalate material.

7. The full-screen optical component of claim 3, wherein the backlight system further comprises:
    a light guide plate comprising a light emitting side, wherein the first prism film is stacked on the light emitting side; and
    a reflector plate stacked on an opposite side of the light emitting side and configured to reflect visible light and transmit infrared light, wherein either the right-angle prism film is stacked between the light guide plate and the reflector plate or the right-angle prism film is stacked on a surface of the reflector plate opposite to the light guide plate.

8. The full-screen optical component of claim 7, wherein the light emitter comprises an emission end face disposed parallel to the display surface and faces the bottom surface, wherein the sensor comprises a sensing end face, and wherein the sensing end face and the emission end face are located on a same plane.

9. The full-screen optical component of claim 8, wherein a separate rib is disposed between the sensing end face and the emission end face and is configured to isolate the light and the reflected light signal sensed by the sensor.

10. The full-screen optical component of claim 7, wherein the reflector plate is made of one of polymethyl methacrylate, polycarbonate, or polyimide materials.

11. The full-screen optical component of claim 8, wherein a light concentration layer is disposed on the sensing end face and is configured to aggregate the reflected light signal on the sensing end face such that the light enters the sensor.

12. The full-screen optical component of claim 1, wherein the electronic device further comprises a substrate comprising an end face disposed parallel to the display surface, wherein the dimmer is disposed on the end face and comprises a bevel, wherein an included angle α is between a Y-axis and an intersection line of the bevel and a Y-Z plane, and between an X-axis and an intersection line of the bevel and an X-Z plane, and wherein the light emitter is located on the bevel and emits the light perpendicular to the bevel.

13. The full-screen optical component of claim 12, wherein the sensor comprises a photosensitive end face, and wherein either the sensor is mounted on the end face and the end face is disposed parallel to the photosensitive end face or the sensor is mounted on the bevel and the bevel is disposed parallel to the photosensitive end face.

14. The full-screen optical component of claim 1, wherein the backlight system further comprises:
   a light homogenizing film stacked with the first prism film; and
   a first through hole disposed on the light homogenizing film and configured to pass the light through.

15. The full-screen optical component of claim 1, wherein the backlight system further comprises:
   a bottom frame; and
   a second through hole disposed on the bottom frame and configured to pass the light through.

16. An electronic device comprising:
   a display screen comprising a display surface; and
   a full-screen optical component comprising:
      a backlight system comprising:
         a first side, wherein the display screen is located on the first side;
         a second side;
         a first prism film comprising a plurality of first prisms disposed in parallel, wherein each first prism comprises:
            a first in-light surface configured to dispose in parallel to the display surface; and
            a first out-light surface; and
         a second prism film stacked on the first prism film and comprising a plurality of second prisms disposed in parallel, wherein each second prism comprises:
            a second in-light surface configured to dispose in parallel to the display surface; and
            a second out-light surface, wherein a second long axis of a second prism is perpendicular to a first long axis of a first prism;
      an active light sensor located on the second side and comprising:
         a light emitter configured to emit light; and
         a sensor configured to sense a reflected light signal of the light; and
      a dimmer coupled to the backlight system and configured to direct the light to the first in-light surface at a first incident angle inclined relative to a vertical direction, such that the light is then emitted from the first out-light surface after being refracted by the first prism, enters the second in-light surface at a second incident angle inclined relative to the vertical direction, and is emitted from the second out-light surface after being refracted by the second prism, such that the light passes through the display screen at a vertical angle.

17. The electronic device of claim 16, wherein the electronic device further comprises a substrate comprising an end face disposed parallel to the display surface, wherein the dimmer is disposed on the end face and comprises a bevel, wherein $\alpha$ is an included angle between a Y-axis and an intersection line of the bevel and a Y-Z plane, and between an X-axis and an intersection line of the bevel and an X-Z plane, and wherein the light emitter is located on the bevel and emits the light perpendicular to the bevel.

18. The electronic device of claim 16, wherein a direction perpendicular to the display screen is a Z-axis, the first long axis is a Y-axis, and the second long axis is an X-axis in a coordinate system, wherein an origin of the coordinate system is located on incident light on the first prism film, wherein the dimmer is further configured to enable an included angle $\alpha$, between the Z-axis and a projection of the light incident on the first in-light surface on an X-Z plane or on a Y-Z plane, calculated as follows:

$$\alpha = \arcsin\left(\eta\cos\left(\frac{\gamma}{2} + \arcsin\left(\frac{\cos(\frac{\gamma}{2})}{\eta}\right)\right)\right),$$

wherein $\gamma$ is a degree of a vertex angle of the first prism and the second prism, and wherein $\eta$ is a refractive index of a material of the first prism and the second prism.

19. The electronic device of claim 18, wherein the dimmer is a right-angle prism film comprising a plurality of right-angle prisms disposed parallelly in sequence, wherein a long axis of a first right-angle prism of the right-angle prisms is perpendicular to an angle bisector of the X-axis and the Y-axis, wherein a bottom surface of the first right-angle prism is parallel to the display surface, wherein the light is incident at a right-angle on the bottom surface and is emitted from a right-angle surface of the first right-angle prism, wherein the light is directly incident on the first in-light surface, wherein an extension direction of the right-angle surface is perpendicular to the first in-light surface, and wherein an emergent angle between the light and the right-angle surface is the same as the first incident angle.

20. The electronic device of claim 19, wherein the right-angle prism film is made of a polyethylene terephthalate material.

* * * * *